(12) United States Patent
Li et al.

(10) Patent No.: US 8,912,012 B2
(45) Date of Patent: Dec. 16, 2014

(54) MAGNETIC TUNNEL JUNCTION DEVICE AND FABRICATION

(75) Inventors: Xia Li, San Diego, CA (US); Seung H. Kang, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 84 days.

(21) Appl. No.: 12/626,269

(22) Filed: Nov. 25, 2009

(65) Prior Publication Data

US 2011/0121417 A1 May 26, 2011

(51) Int. Cl.
*H01L 21/00* (2006.01)
*H01L 43/12* (2006.01)
*H01L 27/22* (2006.01)
*G11C 11/15* (2006.01)
*H01L 43/08* (2006.01)

(52) U.S. Cl.
CPC ............. *H01L 43/12* (2013.01); *H01L 27/224* (2013.01); *G11C 11/15* (2013.01); *H01L 43/08* (2013.01); *H01L 21/00* (2013.01)
USPC ...................................... 438/3; 257/E21.665

(58) Field of Classification Search
USPC .............. 438/3, 653, 257, 902; 257/E21.665
See application file for complete search history.

(56) References Cited

U.S. PATENT DOCUMENTS

| 6,436,824 | B1 | 8/2002 | Chooi et al. |
| 6,518,588 | B1 * | 2/2003 | Parkin et al. ................. 257/3 |
| 6,553,333 | B1 | 4/2003 | Shenk |
| 6,784,094 | B2 | 8/2004 | Yin et al. |
| 6,806,096 | B1 | 10/2004 | Kim et al. |
| 7,009,266 | B2 * | 3/2006 | Shi et al. ...................... 257/421 |
| 7,473,641 | B2 | 1/2009 | Ho et al. |
| 7,527,986 | B1 | 5/2009 | Jung |
| 7,682,841 | B2 * | 3/2010 | Dahmani et al. ................ 438/3 |
| 7,880,249 | B2 * | 2/2011 | Yuan et al. .................... 257/421 |
| 8,673,654 | B2 * | 3/2014 | Hong et al. ..................... 438/3 |
| 2003/0047728 | A1 | 3/2003 | Chen |
| 2003/0059958 | A1 | 3/2003 | Drewes |
| 2004/0137681 | A1 | 7/2004 | Motoyoshi |
| 2005/0276099 | A1 | 12/2005 | Horng et al. |

(Continued)

FOREIGN PATENT DOCUMENTS

| CN | 1670859 A | 9/2005 |
| EP | 1793433 A2 | 6/2007 |

(Continued)

OTHER PUBLICATIONS

International Search Report and Written Opinion—PCT/US2010/057891, ISA/EPO—Jul. 12, 2011.

(Continued)

*Primary Examiner* — Quoc Hoang
(74) *Attorney, Agent, or Firm* — Donald D. Min

(57) ABSTRACT

A magnetic tunnel junction (MTJ) device and fabrication method is disclosed. In a particular embodiment, a method is disclosed that includes forming a magnetic tunnel junction structure above a bottom electrode. The method also includes forming a diffusion barrier layer above and adjacent to the magnetic tunnel junction structure. The method further includes etching back the diffusion barrier layer, removing the diffusion barrier layer above the magnetic tunnel junction structure. The method also includes connecting a top of the magnetic tunnel junction structure to a conductive layer.

46 Claims, 13 Drawing Sheets

(56) References Cited

U.S. PATENT DOCUMENTS

| | | |
|---|---|---|
| 2006/0095889 A1 | 5/2006 | Cote et al. |
| 2007/0014149 A1 | 1/2007 | Nagamine et al. |
| 2007/0120210 A1 | 5/2007 | Yuan et al. |
| 2008/0054323 A1 | 3/2008 | Breitwisch et al. |
| 2009/0130779 A1 | 5/2009 | Li et al. |
| 2009/0261433 A1 | 10/2009 | Kang et al. |
| 2011/0121417 A1 | 5/2011 | Li et al. |

FOREIGN PATENT DOCUMENTS

| | | |
|---|---|---|
| EP | 1926158 A1 | 5/2008 |
| JP | 2002026281 A | 1/2002 |
| JP | 2002171011 A | 6/2002 |
| JP | 2004319725 A | 11/2004 |
| JP | 2004349687 A | 12/2004 |
| JP | 2007158336 A | 6/2007 |
| JP | 2007521629 A | 8/2007 |
| JP | 2007273493 A | 10/2007 |
| JP | 2007305645 A | 11/2007 |
| JP | 2008021816 A | 1/2008 |
| JP | 2008060569 A | 3/2008 |
| JP | 2008310573 A | 12/2008 |
| KR | 20080044298 A | 5/2008 |
| TW | 200609782 | 3/2006 |
| TW | I281246 | 5/2007 |
| WO | WO2004015597 A1 | 2/2004 |
| WO | 2005010998 A1 | 2/2005 |
| WO | 2006070803 A1 | 7/2006 |

OTHER PUBLICATIONS

Partial International Search Report—PCT/US2010/057891, International Search Authority—European Patent Office—Feb. 21, 2011.

Taiwan Search Report—TW099140849—TIPO—Dec. 28, 2013.

Xiao H., "Introduction to Semiconductor Manufacturing Technology," 2001, pp. 178, 385, 461 & 495.

* cited by examiner

MAGNETIC TUNNEL JUNCTION DEVICE AND FABRICATION

I. FIELD

The present disclosure is generally related to magnetic tunnel junction (MTJ) devices and fabrication.

II. DESCRIPTION OF RELATED ART

MTJ elements may be used to create a magnetic random access memory (MRAM). An MTJ element typically includes a pinned layer, a magnetic tunnel barrier, and a free layer, where a bit value is represented by a magnetic moment in the free layer. A bit value stored by an MTJ element is determined by a direction of the magnetic moment of the free layer relative to a direction of a fixed magnetic moment carried by the pinned layer. The magnetization of the pinned layer is fixed while the magnetization of the free layer may be switched.

When fabricating the MTJ element, etching the MTJ layers to form the MTJ element may cause oxidation of the surface of the MTJ element if the etch chemical includes oxygen. The oxidation layer may have a thickness of about 30 Angstroms (Å) or about 3 nanometers (nm). Removal of the oxidation layer from the top of the MTJ element to reduce series resistance can require more pre-cleaning and over-etching. However, the MTJ top contact opening has a narrow process window to remove the top oxidation layer of the MTJ element due to the wafer topography and etch uniformity issues. Increasing a pre-sputter clear process of the top electrode of the MTJ element may cause more loss of the top layer of the MTJ layers at the center region of the wafer, which may reduce process margins.

III. SUMMARY

The MTJ etch process may be modified to add an in-situ silicon nitride (SiN) deposit and etch back process to remove an oxidation layer from the top of an MTJ structure. This silicon nitride (SiN) etch back process has a large over-etch process window and may reduce the burden on the subsequent pre-clean process and improve the pre-clean process window. The whole MTJ process integration and process window may be increased.

In a particular embodiment, a method is disclosed that includes forming a magnetic tunnel junction structure above a bottom electrode. The method also includes forming a diffusion barrier layer above and adjacent to the magnetic tunnel junction structure. The method further includes etching back the diffusion barrier layer, removing the diffusion barrier layer above the magnetic tunnel junction structure. The method also includes connecting a top of the magnetic tunnel junction structure to a conductive layer.

In another particular embodiment, a method is disclosed that includes forming magnetic tunnel junction layers above a bottom electrode. The method also includes patterning a magnetic tunnel junction structure using an etching process stopping at the bottom electrode. The method further includes performing an in-situ sputter clean to remove a sidewall and top oxidation layer from a sidewall and top of the magnetic tunnel junction structure. The method also includes forming a diffusion barrier layer above and adjacent to the magnetic tunnel junction structure. The method further includes etching back the diffusion barrier layer, removing a top oxidation layer from a top of the magnetic tunnel junction structure and leaving a portion of the diffusion barrier layer adjacent to the magnetic tunnel junction structure. The method also includes connecting the top of the magnetic tunnel junction structure to a conductive layer.

In another particular embodiment, a method is disclosed that includes forming a bottom cap layer above a first insulating layer. The method also includes performing a first copper damascene process to open a bottom metal trench and a bottom via in the first insulating layer, to plate copper, and to perform a copper chemical mechanical planarization (CMP). The method further includes forming a bottom electrode above the bottom cap layer and above the copper in the bottom metal trench. The method also includes forming magnetic tunnel junction layers above the bottom electrode, forming a hardmask above the magnetic tunnel junction layers, and patterning magnetic tunnel junction structures. The method further includes forming a magnetic tunnel junction etch-back layer above and adjacent to the magnetic tunnel junction structures and above the bottom electrode and etching back the diffusion barrier layer, leaving a portion of the diffusion barrier layer adjacent to the magnetic tunnel junction structures. The method also includes forming a cap layer above the magnetic tunnel junction structures and adjacent to the portion of the diffusion barrier layer adjacent to the magnetic tunnel junction structures and above the bottom electrode. The method further includes forming a second insulating layer above the cap layer and planarizing the second insulating layer and opening tops of the magnetic tunnel junction structures. The method also includes forming a top electrode above the planarized second insulating layer and above the tops of the magnetic tunnel junction structures and patterning the top electrode and the bottom electrode. The method further includes forming and planarizing a third insulating layer above the patterned top electrode and above the bottom cap layer and performing a second copper damascene process to open a top metal trench in the third insulating layer to the patterned top electrode, to plate copper, and to perform a copper chemical mechanical planarization.

In another particular embodiment, an apparatus is disclosed that includes a magnetic tunnel junction structure above a bottom electrode. The apparatus also includes a portion of a diffusion barrier layer adjacent to the magnetic tunnel junction structure. The apparatus further includes a top of the magnetic tunnel junction structure connected to a conductive layer.

One particular advantage provided by at least one of the disclosed embodiments is to remove an oxidation layer from the top of an MTJ structure using a diffusion barrier etch back process that has a large over-etch process window. The diffusion barrier etch back process may reduce the burden on a subsequent pre-clean process and improve the pre-clean process window. The whole MTJ process integration and process window may be increased. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
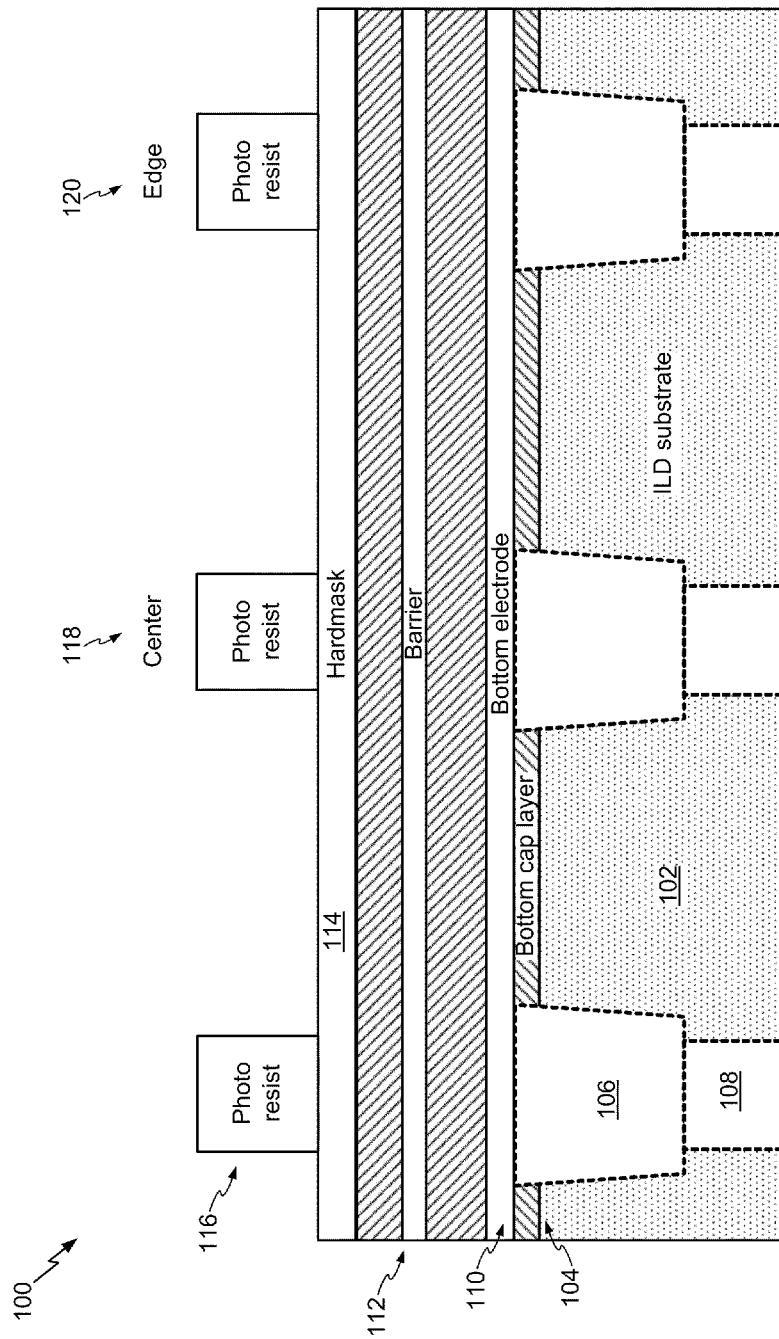
FIG. 1 is a first illustrative diagram of at least one stage in a process of fabricating a magnetic tunnel junction (MTJ) device after forming MTJ layers and photoresist masks.

Particular embodiments of the present disclosure are described below with reference to the drawings. In the description, common features are designated by common reference numbers through the drawings. Referring to FIG. 1, a first illustrative diagram of at least one stage in a process of fabricating a magnetic tunnel junction (MTJ) device is depicted and generally designated 100. A bottom cap layer 104 may be formed above a first insulating layer 102. For example, the bottom cap layer 104 may be deposited on the first insulating layer 102. In a particular embodiment, the bottom cap layer 104 includes silicon carbide (SiC). A first copper damascene process may be performed to open a bottom metal trench 106 and a bottom via 108 in the first insulating layer 102, plate copper, and perform a copper chemical mechanical planarization. A bottom electrode 110 may be formed above the bottom cap layer 104 and above the copper in the bottom metal trench 106. For example, the bottom electrode 110 may be deposited on the bottom cap layer 104 and on the copper in the bottom metal trench 106. In a particular embodiment, the bottom electrode 110 includes at least one of tantalum and tantalum nitride.

Magnetic tunnel junction layers 112 may be formed above the bottom electrode 110. For example, the magnetic tunnel junction layers 112 may include an antiferromagnetic (AFM) layer, a pinning layer, a spacer, a fixed pinned layer, a tunnel barrier layer, a free layer, and an MTJ cap layer deposited on the bottom electrode 110. In a particular embodiment, an easy axis magnetic tunnel junction magnetic anneal of the pinning layer and the free layer of the magnetic tunnel junction layers 112 aligns a magnetic field orientation of subsequently formed magnetic tunnel junction structures 202, shown in FIG. 2. A hardmask 114 may be formed above the magnetic tunnel junction layers 112. For example, the hardmask 114 may be deposited on the magnetic tunnel junction layers 112. Photoresist 116 may be formed above the hardmask 114 and patterned to pattern the magnetic tunnel junction structures 202 shown in FIG. 2. For example, the photoresist may be deposited on the hardmask 114 and may be patterned by photolithography techniques. A center region 118 and an edge region 120 of a representative wafer are shown.

Figure 2:
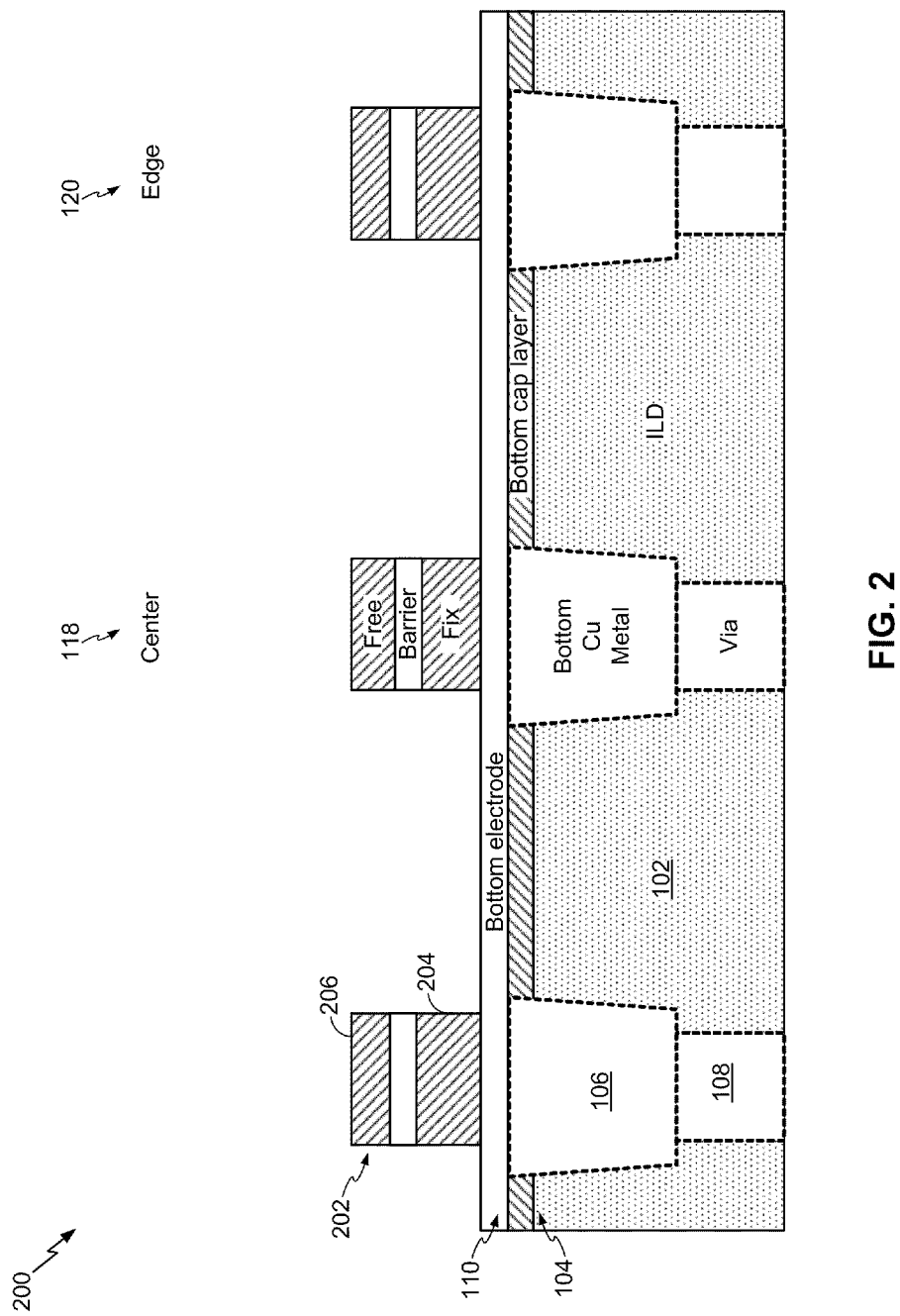
FIG. 2 is a second illustrative diagram of at least one stage in the process of fabricating a magnetic tunnel junction (MTJ) device after patterning MTJ structures.

Referring to FIG. 2, a second illustrative diagram of at least one stage in the process of fabricating a magnetic tunnel junction (MTJ) device is depicted and generally designated 200. The magnetic tunnel junction structures 202 may be formed above the bottom electrode 110 and also may be formed above the copper in the bottom metal trench 106. In a particular embodiment, an in-situ sputter clean is performed to remove an oxidation layer (not shown) from the magnetic tunnel junction structures 202 after an MTJ etching process. The in-situ sputter clean may remove the oxidation layer from tops 206 and sidewalls 204 of the magnetic tunnel junction structures 202. The oxidation layer (not shown) may be formed on the magnetic tunnel junction structures 202 during a magnetic tunnel junction etch process used to form the magnetic tunnel junction structures 202 because of oxygen present in the chemicals used in the magnetic tunnel junction etch process.

Figure 3:
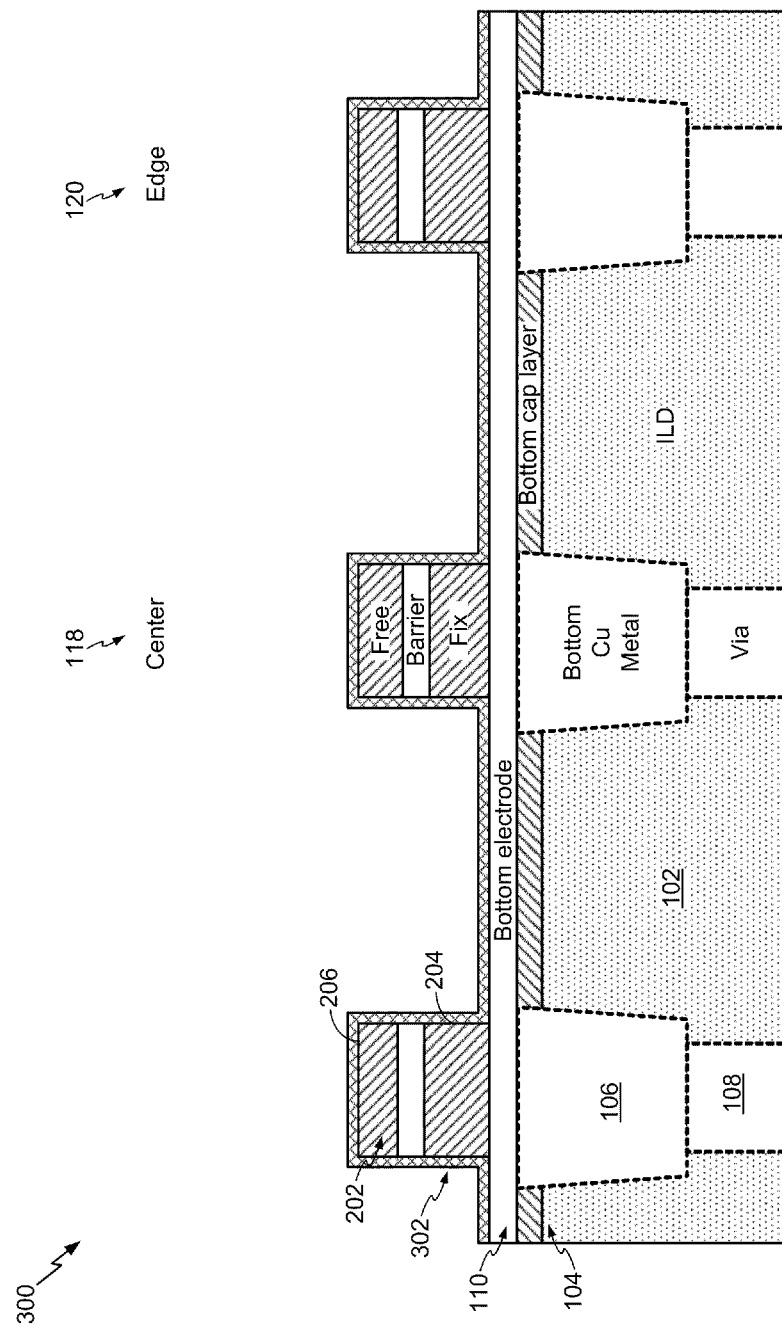
FIG. 3 is a third illustrative diagram of at least one stage in the process of fabricating a magnetic tunnel junction (MTJ) device after forming a diffusion barrier layer.

Referring to FIG. 3, a third illustrative diagram of at least one stage in the process of fabricating a magnetic tunnel junction (MTJ) device is depicted and generally designated 300. A diffusion barrier layer 302 may be formed above and adjacent to the magnetic tunnel junction structures 202 and above the bottom electrode 110. For example, the diffusion barrier layer 302 may be deposited on the magnetic tunnel junction structures 202 and adjacent to the sidewalls 204 of the magnetic tunnel junction structures 202 and on the bottom electrode 110. In a particular embodiment, the diffusion barrier layer 302 is formed in-situ. In a particular embodiment, the diffusion barrier layer 302 includes silicon nitride (SiN).

Figure 4:
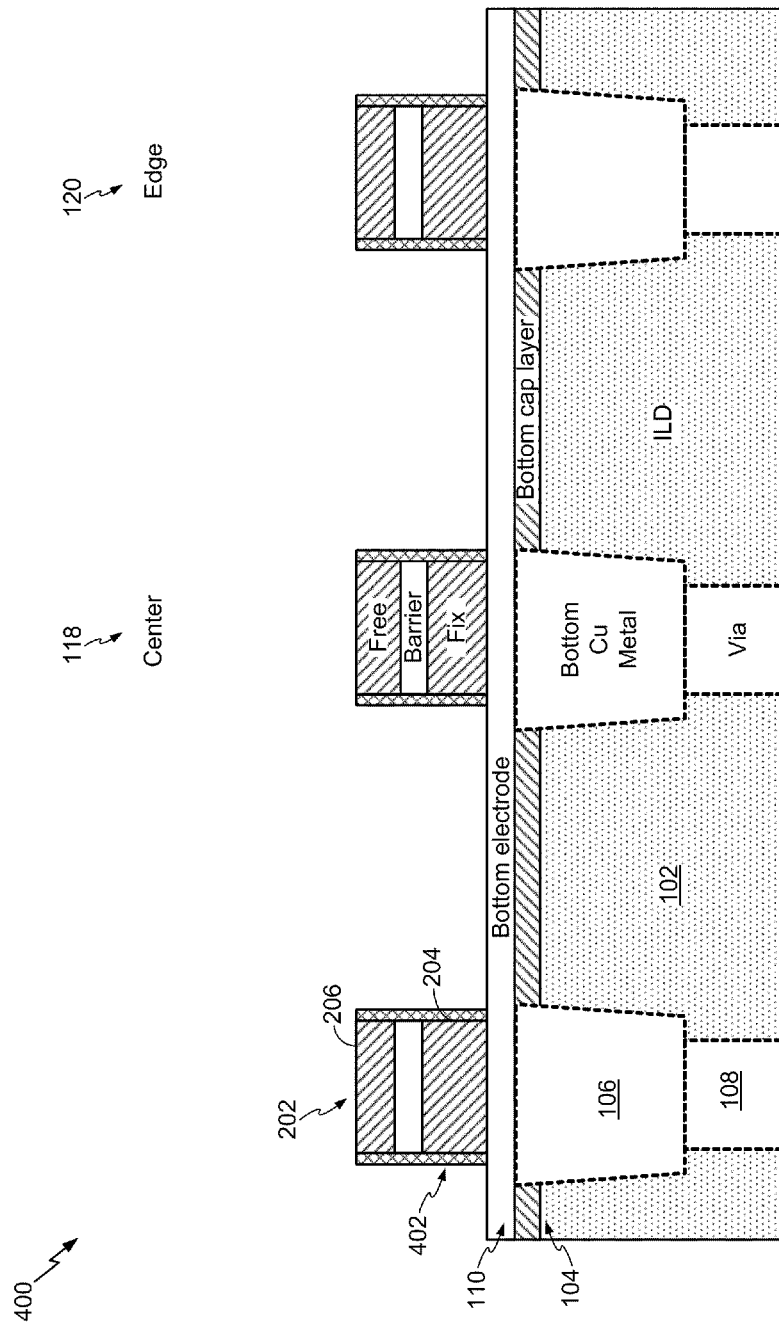
FIG. 4 is a fourth illustrative diagram of at least one stage in the process of fabricating a magnetic tunnel junction (MTJ) device after etching back the diffusion barrier layer, removing the diffusion barrier layer from tops of the MTJ structures, and leaving a portion of the diffusion barrier layer adjacent a sidewall of the MTJ structures.

Referring to FIG. 4, a fourth illustrative diagram of at least one stage in the process of fabricating a magnetic tunnel junction (MTJ) device is depicted and generally designated 400. The diffusion barrier layer 302 shown in FIG. 3 is etched back, leaving a portion 402 of the diffusion barrier layer 302 adjacent to the sidewalls 204 of the magnetic tunnel junction structures 202. In a particular embodiment, etching back the diffusion barrier layer 302 shown in FIG. 3 is performed in-situ. In a particular embodiment, etching back the diffusion barrier layer 302 shown in FIG. 3 is performed without formation of an oxidation layer on the magnetic tunnel junction structures 202 because oxygen is not present in the chemicals used in the etch back process. In a particular embodiment, etching back the diffusion barrier layer 302 shown in FIG. 3 has an effect of increasing an over-etch process margin. For example, the oxidation layer present on the tops 206 of the magnetic tunnel junction structures 202 is removed when the diffusion barrier layer 302 shown in FIG. 3 is removed from the tops 206 of the magnetic tunnel junction structures 202 during the etch back process due to the absence of topography issues from the tops 206 of the MTJ structures 202 and the increased over-etch process margin of the etch back process.

Figure 5:
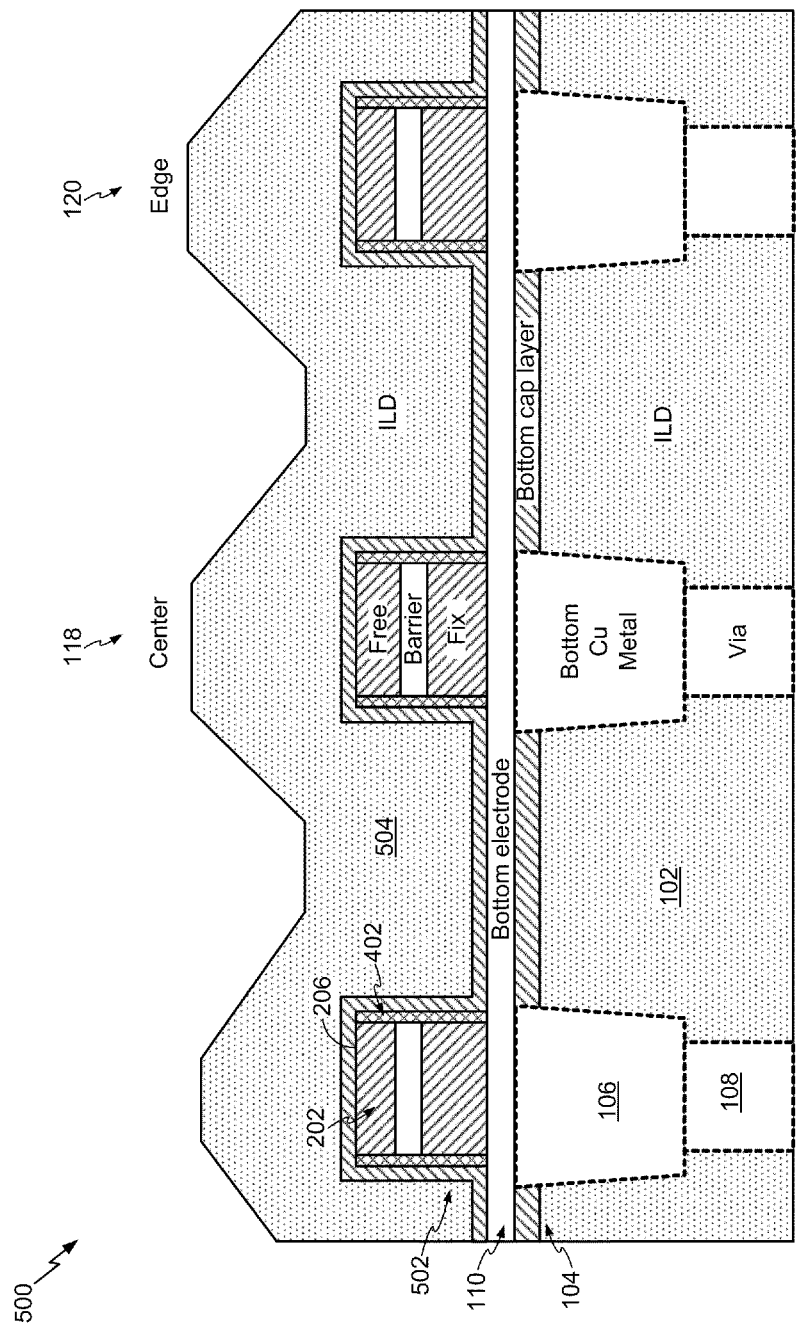
FIG. 5 is a fifth illustrative diagram of at least one stage in the process of fabricating a magnetic tunnel junction (MTJ) device after forming a cap layer and an insulating layer above the cap layer.

Referring to FIG. 5, a fifth illustrative diagram of at least one stage in the process of fabricating a magnetic tunnel junction (MTJ) device is depicted and generally designated 500. A cap layer 502 is formed in-situ above the magnetic tunnel junction structures 202 and adjacent to the portion 402 of the diffusion barrier layer adjacent to the magnetic tunnel junction structures 202 and above the bottom electrode 110. For example, the cap layer 502 may be deposited on the magnetic tunnel junction structures 202 and adjacent to the portion 402 of the diffusion barrier layer adjacent to the magnetic tunnel junction structures 202 and on the bottom electrode 110. In a particular embodiment, the cap layer 502 includes silicon nitride (SiN). A second insulating layer 504 may be formed above the cap layer 502. For example, the second insulating layer 504 may be deposited above the cap layer 502.

Figure 6:
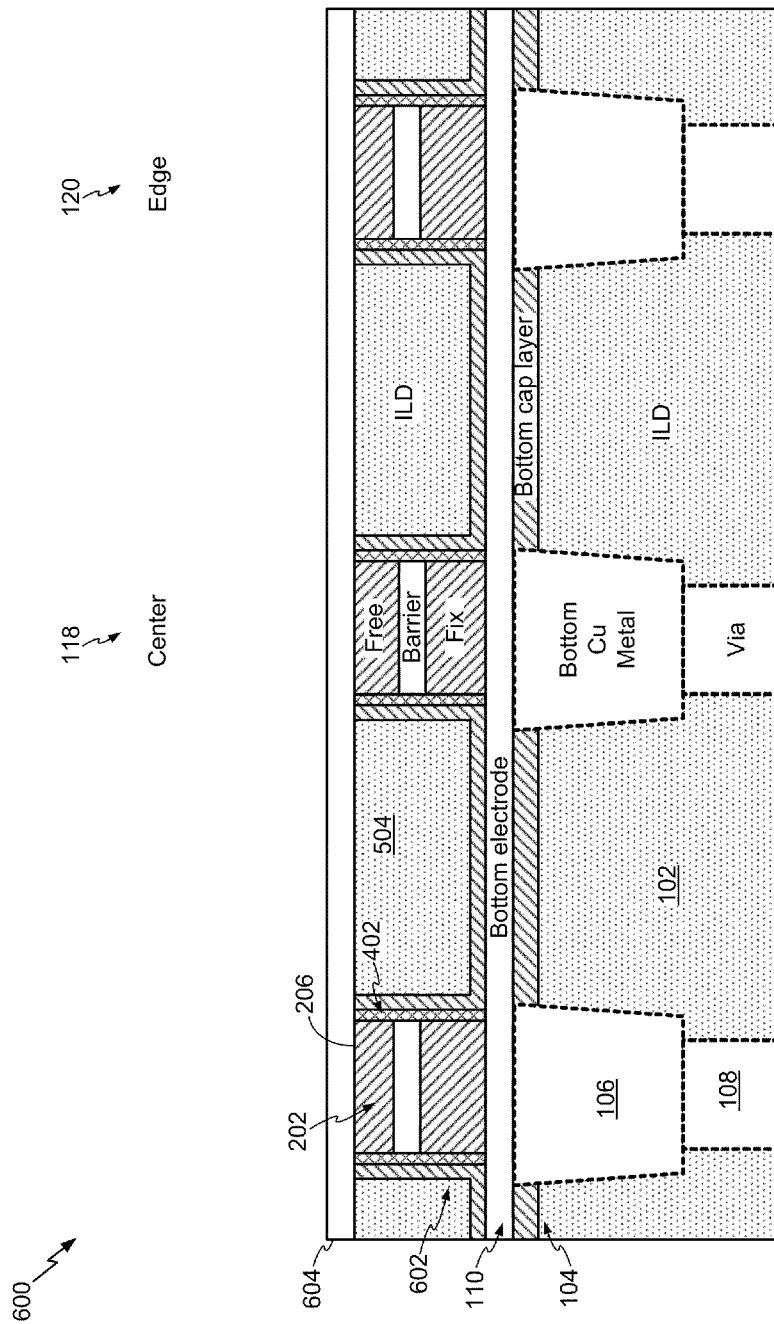
FIG. 6 is a sixth illustrative diagram of at least one stage in the process of fabricating a magnetic tunnel junction (MTJ) device after planarizing the insulating layer and opening tops of the MTJ structures and forming a top electrode above the tops of the MTJ structures and above the planarized insulating layer.

Referring to FIG. 6, a sixth illustrative diagram of at least one stage in the process of fabricating a magnetic tunnel junction (MTJ) device is depicted and generally designated 600. The second insulating layer 504 may be planarized and the tops 206 of the magnetic tunnel junction structures 202 may be opened. The planarizing of the second insulating layer 504 and the opening of the tops 206 of the magnetic tunnel junction structures 202 may leave a portion 602 of the cap layer 502 shown in FIG. 5 above the bottom electrode 110 and adjacent to the portion 402 of the diffusion barrier layer 302 shown in FIG. 3 that is adjacent to the magnetic tunnel junction structures 202. A top electrode 604 may be formed above the planarized second insulating layer 504 and above the tops 206 of the magnetic tunnel junction structures 202. For example, the top electrode 604 may be deposited on the planarized second insulating layer 504 and on the tops 206 of the magnetic tunnel junction structures 202. In a particular embodiment, the top electrode 604 includes at least one of tantalum and tantalum nitride.

The top electrode 604 contacts the tops 206 of the magnetic tunnel junction structures 202 without an intervening oxidation layer. Any oxidation layer present on the tops 206 of the magnetic tunnel junction structures 202 is removed when the diffusion barrier layer 302 shown in FIG. 3 is removed from the tops 206 of the magnetic tunnel junction structures 202 during the etch back process and a pre-sputter clean of the top electrode 604 deposition process. The absence of an intervening oxidation layer lowers the series resistance between the top electrode 604 and the tops 206 of the magnetic tunnel junction structures 202 in comparison to a situation where an intervening oxidation layer is present.

Figure 7:
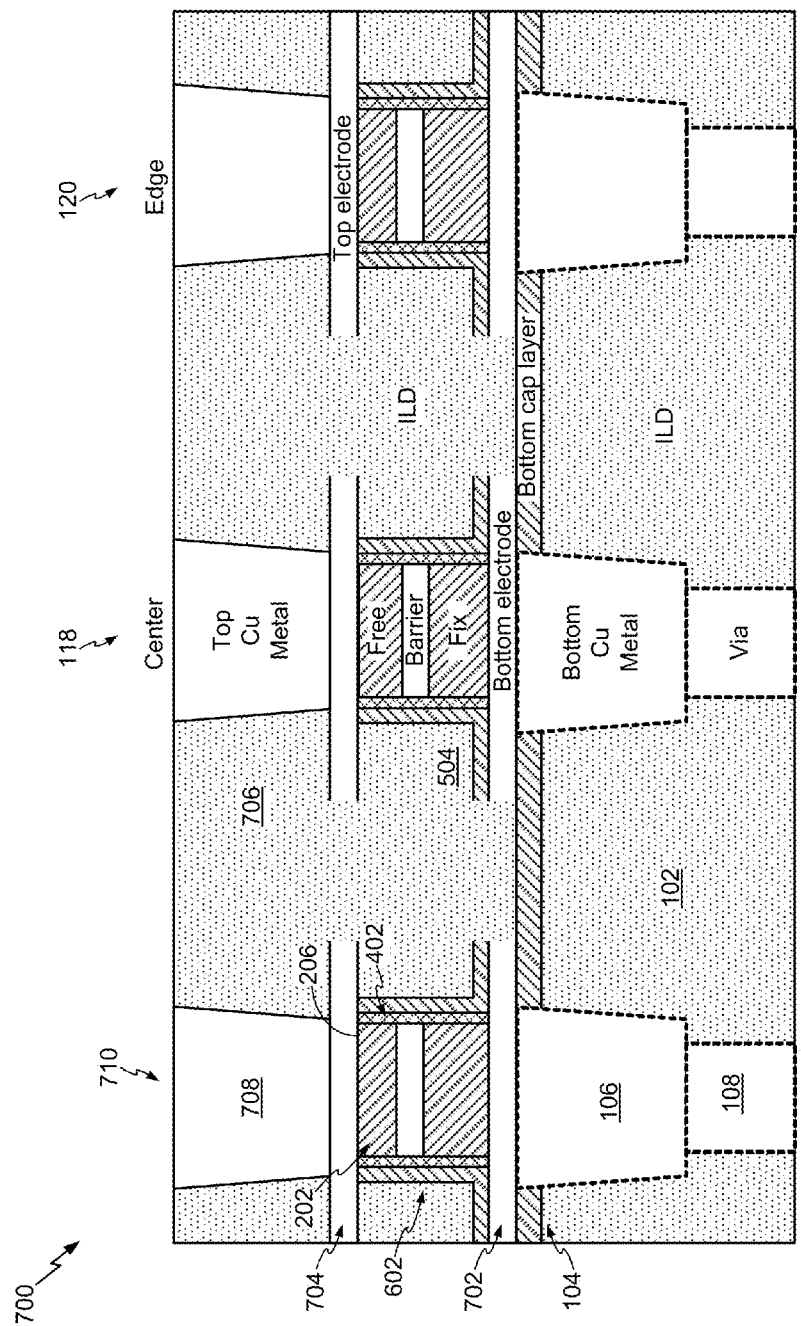
FIG. 7 is a seventh illustrative diagram of at least one stage in the process of fabricating a magnetic tunnel junction (MTJ) device after patterning the top and bottom electrodes, forming another insulating layer thereabove, performing a CMP of the insulating layer, and performing a copper damascene process to connect the patterned top electrodes to a conductive layer.

Referring to FIG. 7, a seventh illustrative diagram of at least one stage in the process of fabricating a magnetic tunnel junction (MTJ) device is depicted and generally designated 700. The bottom electrode 110 of FIG. 1 and the top electrode 604 of FIG. 6 are patterned to form a patterned bottom electrode 702 and a patterned top electrode 704. A third insulating layer 706 may be formed and planarized above the patterned top electrode 704 and above the bottom cap layer 104. For example, the third insulating layer 706 may be deposited on the patterned top electrode 704 and on the bottom cap layer 104 and planarized. A second copper damascene process may be performed to open a top metal trench 708 in the third insulating layer 706 to the patterned top electrode 704, plate copper, and perform a copper chemical mechanical planarization. A magnetic tunnel junction (MTJ) device 710 may be formed that includes the magnetic tunnel junction structure 202 above the patterned bottom electrode 702. The MTJ device 710 also includes the portion 402 of the diffusion barrier layer 302 of FIG. 3 adjacent to the magnetic tunnel junction structure 202. The MTJ device 710 further includes the top 404 of the magnetic tunnel junction structure 202 connected to a conductive layer, the copper in the top metal trench 708, via the patterned top electrode 704.

Steps and structures may have been omitted in FIGS. 1-7 for ease of explanation and clarity. For example, various of the MTJ layers 112 of FIG. 1 may be composite layers. As another example, a protective cap layer may be formed over the patterned top electrode 704 and etched as part of the second damascene process.

Figure 8:
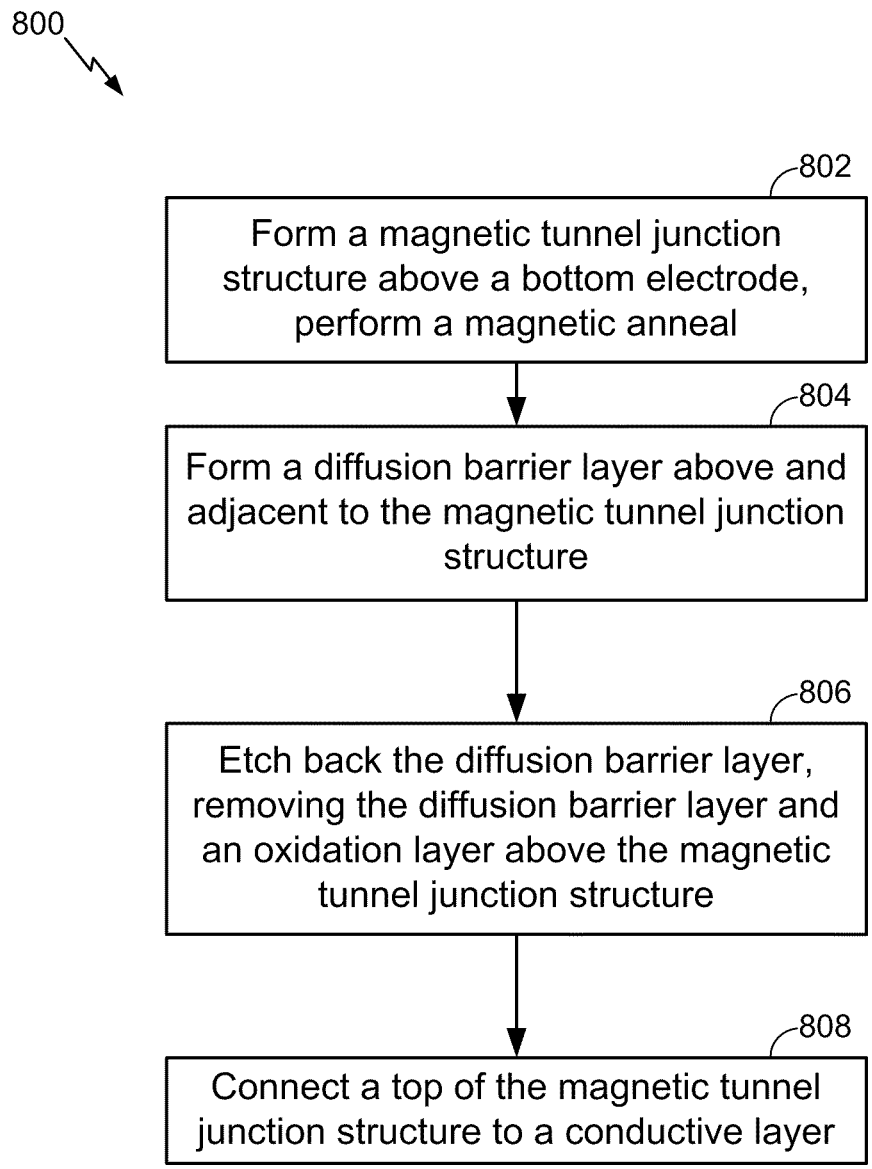
FIG. 8 is a flow diagram of a first illustrative embodiment of a method of forming a magnetic tunnel junction (MTJ) device.

FIG. 8 is a flow diagram of a first illustrative embodiment 800 of a method of forming a magnetic tunnel junction (MTJ) device. In the first illustrative embodiment 800, the method includes forming a magnetic tunnel junction structure above a bottom electrode, at 802. For example, the magnetic tunnel junction structure 202 of FIG. 2 may be formed above the bottom electrode 110 of FIG. 1 and a magnetic anneal may be performed. The method also includes forming a diffusion barrier layer above and adjacent to the magnetic tunnel junction structure, at 804. For example, the diffusion barrier layer 302 of FIG. 3 may be formed above and adjacent to the magnetic tunnel junction structure 202 of FIG. 2.

The method further includes etching back the diffusion barrier layer, removing the diffusion barrier layer above the magnetic tunnel junction structure, at 806. For example, the diffusion barrier layer 302 of FIG. 3 is etched back, removing the diffusion barrier layer 302 and an oxidation layer above the magnetic tunnel junction structure 202 of FIG. 2, as shown in FIG. 4. In a particular embodiment, etching back the diffusion barrier layer 302 of FIG. 3 leaves the portion 402 of the diffusion barrier layer 302 that is adjacent to the magnetic tunnel junction structure 202 of FIG. 2. The method also includes connecting a top of the magnetic tunnel junction structure to a conductive layer, at 808. For example, the top 404 (shown in FIG. 4) of the magnetic tunnel junction structure 202 may be connected to the patterned top electrode 704 of FIG. 7 that is connected to the copper in the top metal trench 708.

Figure 9:
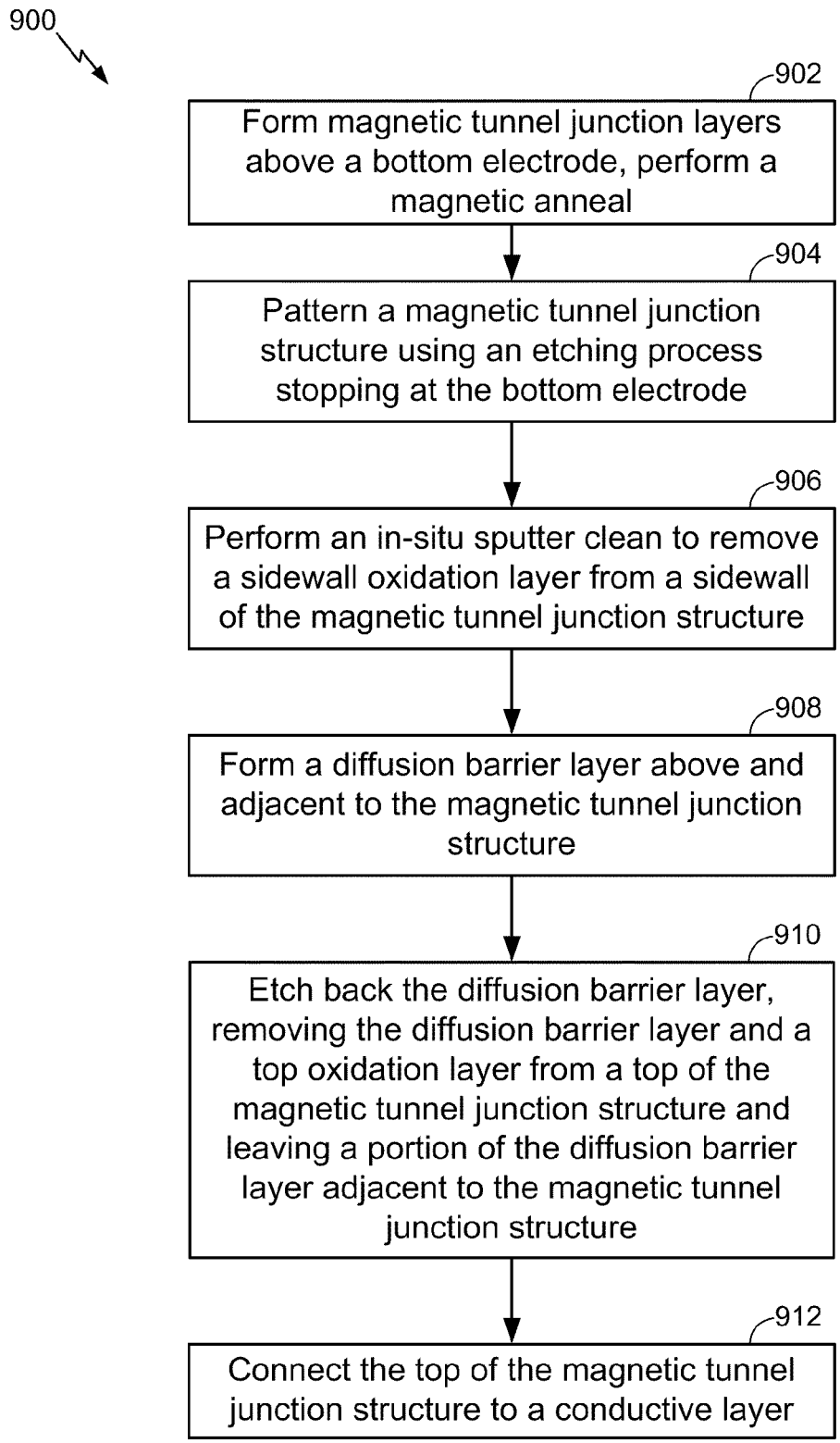
FIG. 9 is a flow diagram of a second illustrative embodiment of a method of forming a magnetic tunnel junction (MTJ) device.

FIG. 9 is a flow diagram of a second illustrative embodiment 900 of a method of forming a magnetic tunnel junction (MTJ) device. In the second illustrative embodiment 900, the method includes forming magnetic tunnel junction layers above a bottom electrode, at 902. For example, the magnetic tunnel junction layers 112 of FIG. 1 are formed above the bottom electrode 110 of FIG. 1 and a magnetic anneal may be performed. The method also includes patterning a magnetic tunnel junction structure using an etching process stopping at the bottom electrode, at 904. For example, the hardmask 114 and the photoresist 116 of FIG. 1 may be used to pattern the magnetic tunnel junction structures 202 of FIG. 2. The method further includes performing an in-situ sputter clean to remove a sidewall oxidation layer from a sidewall of the magnetic tunnel junction structure, at 906. For example, the magnetic tunnel junction structures 202 of FIG. 2 may be subjected to an in-situ sputter clean to remove sidewall oxidation layers (not shown) from the sidewalls 204 of FIG. 2 of the magnetic tunnel junction structures 202.

The method also includes forming a diffusion barrier layer above and adjacent to the magnetic tunnel junction structure, at 908. For example, the diffusion barrier layer 302 of FIG. 3 is a diffusion layer that is formed above and adjacent to the magnetic tunnel junction structures 202 of FIG. 2. In a particular embodiment, the diffusion barrier layer is formed in-situ. In a particular embodiment, the diffusion barrier layer includes at least one of silicon nitride (SiN) and silicon carbide (SiC).

The method further includes etching back the diffusion barrier layer, removing a top oxidation layer from a top of the magnetic tunnel junction structure and leaving a portion of the diffusion barrier layer adjacent to the magnetic tunnel junction structure, at 910. For example, the diffusion barrier layer 302 of FIG. 3 is etched back, removing the diffusion barrier layer and a top oxidation layer from the tops 206 of FIG. 2 of the magnetic tunnel junction structures 202 of FIG. 2, and leaving the portion 402 of the diffusion barrier layer 302 adjacent to the magnetic tunnel junction structures 202. In a particular embodiment, etching back the diffusion barrier layer is performed in-situ.

The method also includes connecting the top of the magnetic tunnel junction structure to a conductive layer, at 912. For example, the tops 206 of FIG. 2 of the magnetic tunnel junction structures 202 of FIG. 2 may be connected to the patterned top electrode 704 of FIG. 7 that is connected to the copper in the top metal trench 708 of FIG. 7.

Figure 10:
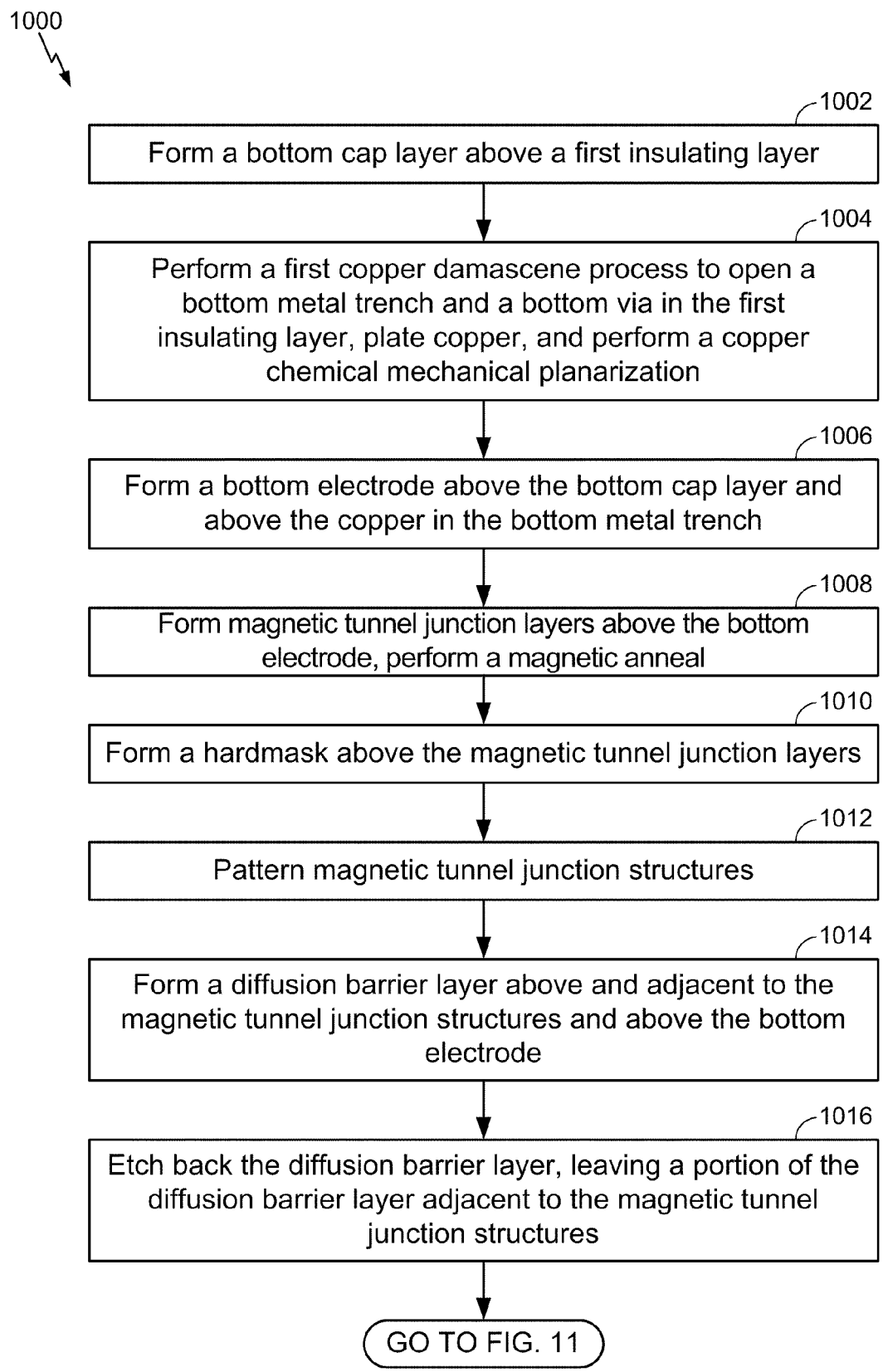
FIG. 10 is a flow diagram of a first portion of a third illustrative embodiment of a method of forming a magnetic tunnel junction (MTJ) device.

FIG. 10 is a flow diagram of a first portion 1000 of a third illustrative embodiment of a method of forming a magnetic tunnel junction (MTJ) device. In the first portion 1000 of the third illustrative embodiment, the method includes forming a bottom cap layer above a first insulating layer, at 1002. For example, the bottom cap layer 104 of FIG. 1 is formed above the first insulating layer 102 of FIG. 1. The method also includes performing a first copper damascene process to open a bottom metal trench and a bottom via in the first insulating layer, plate copper, and perform a copper chemical mechanical planarization, at 1004. For example, a first copper damascene process is performed to open the bottom metal trench 106 of FIG. 1 and the bottom via 108 of FIG. 1 in the first insulating layer 102 of FIG. 1, to plate copper, and to perform a copper chemical mechanical planarization.

The method further includes forming a bottom electrode above the bottom cap layer and above the copper in the bottom metal trench, at 1006. For example, the bottom electrode 110 of FIG. 1 may be formed above the bottom cap layer 104 of FIG. 1 and above the copper in the bottom metal trench 106 of FIG. 1. The method also includes forming magnetic tunnel junction layers above the bottom electrode, at 1008, forming a hardmask above the magnetic tunnel junction layers, at 1010, and patterning magnetic tunnel junction structures, at 1012. For example, the magnetic tunnel junction layers 112 of FIG. 1 are formed above the bottom electrode 110 of FIG. 1, a magnetic anneal may be performed, the hardmask 114 of FIG. 1 is formed above the magnetic tunnel junction layers 112, and the hardmask 114 and the photoresist 116 of FIG. 1 are used to pattern the magnetic tunnel junction structures 202 of FIG. 2.

The method further includes forming a diffusion barrier layer above and adjacent to the magnetic tunnel junction structures and above the bottom electrode, at 1014, and etching back the diffusion barrier layer, leaving a portion of the diffusion barrier layer adjacent to the magnetic tunnel junction structures, at 1016. For example, the diffusion barrier layer 302 of FIG. 3 is formed above and adjacent to the magnetic tunnel junction structures 202 of FIG. 2 and above the bottom electrode 110 of FIG. 1, and the diffusion barrier layer 302 is etched back, leaving the portion 402 of FIG. 4 of the diffusion barrier layer 302 adjacent to the magnetic tunnel junction structures 202.

Figure 11:
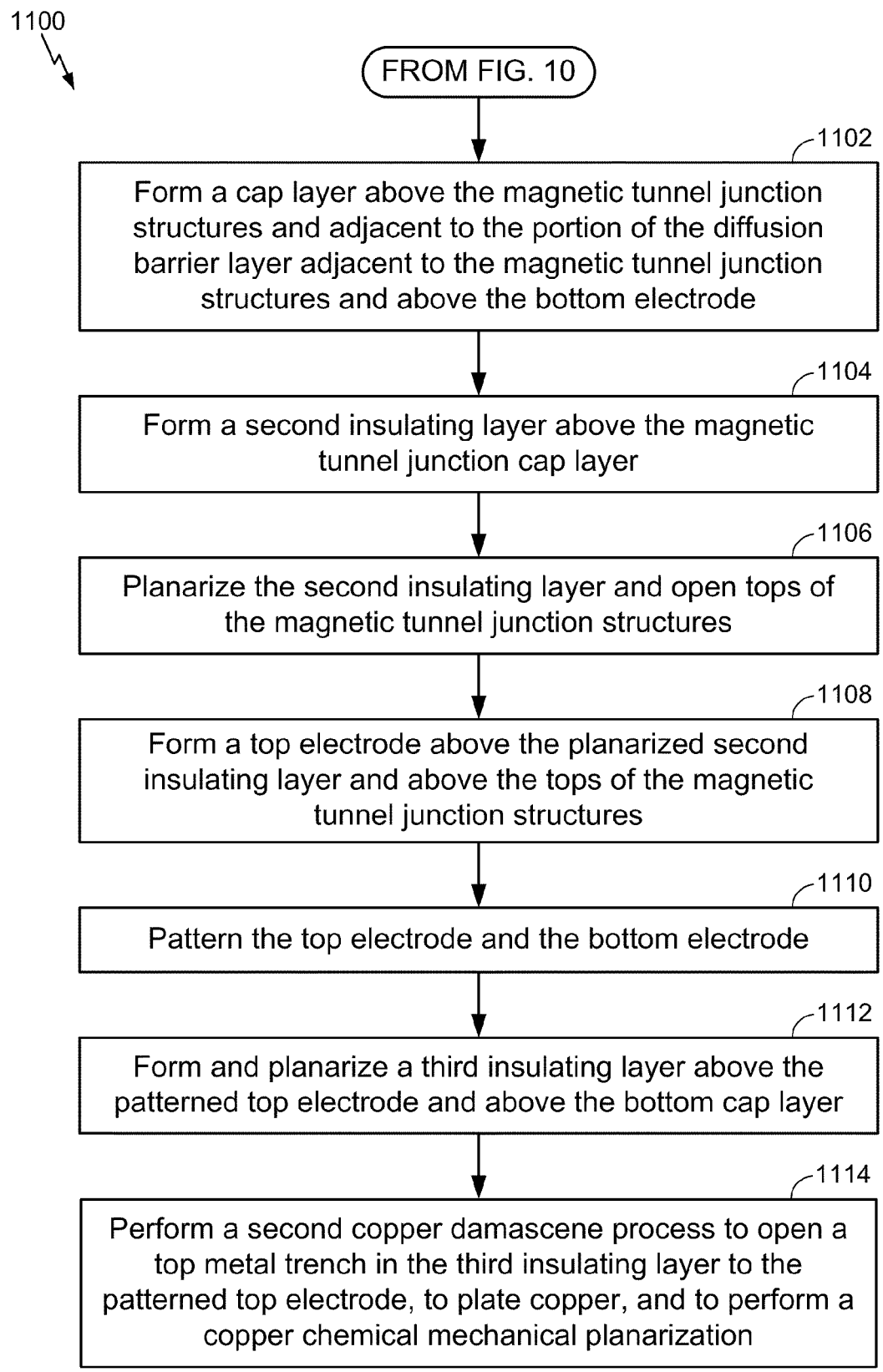
FIG. 11 is a flow diagram of a second portion of the third illustrative embodiment of a method of forming a magnetic tunnel junction (MTJ) device.

FIG. 11 is a flow diagram of a second portion 1100 of the third illustrative embodiment of a method of forming a magnetic tunnel junction (MTJ) device. In the second portion 1100 of the third illustrative embodiment, the method includes forming a cap layer above the magnetic tunnel junction structures and adjacent to the portion of the diffusion barrier layer that is adjacent to the magnetic tunnel junction structures and above the bottom electrode, at 1102. For example, the cap layer 502 of FIG. 5 is formed above the magnetic tunnel junction structures 202 of FIG. 2 and adjacent to the portion 402 of FIG. 4 of the diffusion barrier layer 302 of FIG. 3 that is adjacent to the magnetic tunnel junction structures 202 of FIG. 2 and above the bottom electrode 110 of FIG. 1. In a particular embodiment, the cap layer is formed in-situ. The method further includes forming a second insulating layer above the cap layer, at 1104, and planarizing the second insulating layer and opening tops of the magnetic tunnel junction structures, at 1106. For example, the second insulating layer 504 of FIG. 5 is formed above the cap layer 502 of FIG. 5, and the second insulating layer 504 is planarized, opening the tops 206 of FIG. 2 of the magnetic tunnel junction structures 202 of FIG. 2.

The method also includes forming a top electrode above the planarized second insulating layer and above the tops of the magnetic tunnel junction structures, at 1108, and patterning the top electrode and the bottom electrode, at 1110. For example, the top electrode 604 of FIG. 6 is formed above the planarized second insulating layer 504 of FIG. 5 and above the tops 206 of FIG. 2 of the magnetic tunnel junction structures 202 of FIG. 2, and the top electrode 604 of FIG. 6 and the bottom electrode 110 of FIG. 1 are patterned to become the patterned top electrode 704 of FIG. 7 and the patterned bottom electrode 702 of FIG. 7.

The method further includes forming and planarizing a third insulating layer above the patterned top electrode and above the bottom cap layer, at 1112, and performing a second copper damascene process to open a top metal trench in the third insulating layer to the patterned top electrode, to plate copper, and to perform a copper chemical mechanical planarization, at 1114. For example, the third insulating layer 706 of FIG. 7 is formed and planarized above the patterned top electrode 704 of FIG. 7 and above the bottom cap layer 104 of FIG. 1, and a second copper damascene process is performed to open the top metal trench 708 of FIG. 7 in the third insulating layer 706 to the patterned top electrode 704, to plate copper, and to perform a copper chemical mechanical planarization.

Figure 12:
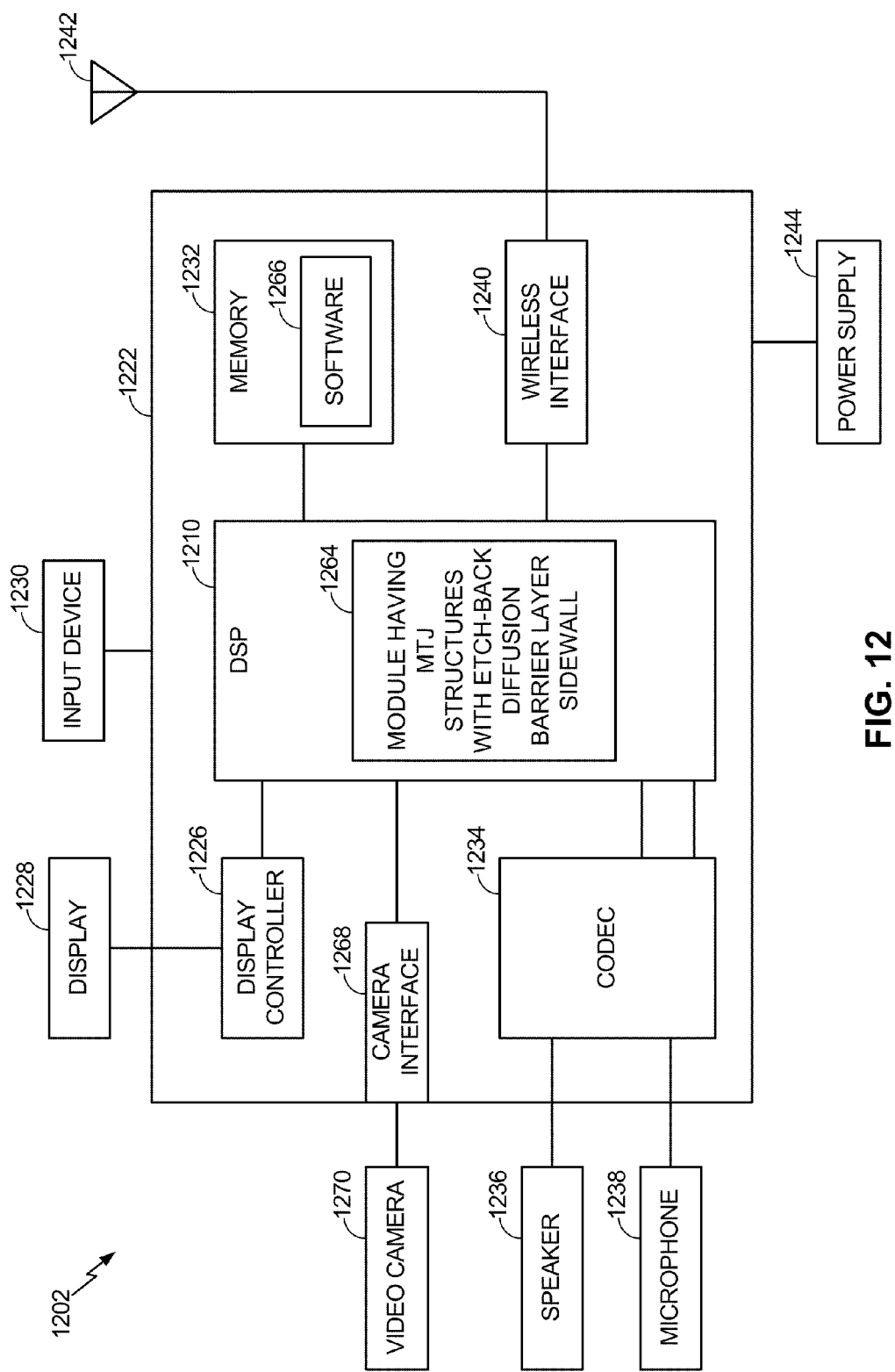
FIG. 12 is a block diagram of a particular embodiment of a portable communication device including a module having MTJ structures with an etch-back diffusion barrier layer sidewall.

FIG. 12 is a block diagram of particular embodiment of a system 1200 including a module having MTJ structures with an etch-back diffusion barrier layer sidewall 1264. The system 1200 may be implemented in a portable electronic device and includes a processor 1210, such as a digital signal processor (DSP), coupled to computer readable medium, such as a memory 1232, storing computer readable instructions, such as software 1266. The system 1200 includes the module having MTJ structures with an etch-back diffusion barrier layer sidewall 1264. In an illustrative example, the module having MTJ structures with an etch-back diffusion barrier layer sidewall 1264 includes the MTJ structure of FIG. 7, produced in accordance with any of the embodiments of FIGS. 8-11, or any combination thereof. The module having MTJ structures with an etch-back diffusion barrier layer sidewall 1264 may be in the processor 1210 or may be a separate device or circuitry (not shown). In a particular embodiment, as shown in FIG. 12, the module having MTJ structures with an etch-back diffusion barrier layer sidewall 1264 is accessible to the digital signal processor (DSP) 1210. In another particular embodiment, the memory 1232 may include an STT-MRAM memory array that includes the module having MTJ structures with an etch-back diffusion barrier layer sidewall 1264.

A camera interface 1268 is coupled to the processor 1210 and also coupled to a camera, such as a video camera 1270. A display controller 1226 is coupled to the processor 1210 and to a display device 1228. A coder/decoder (CODEC) 1234 can also be coupled to the processor 1210. A speaker 1236 and a microphone 1238 can be coupled to the CODEC 1234. A wireless interface 1240 can be coupled to the processor 1210 and to a wireless antenna 1242.

In a particular embodiment, the processor 1210, the display controller 1226, the memory 1232, the CODEC 1234, the wireless interface 1240, and the camera interface 1268 are included in a system-in-package or system-on-chip device 1222. In a particular embodiment, an input device 1230 and a power supply 1244 are coupled to the system-on-chip device 1222. Moreover, in a particular embodiment, as illustrated in FIG. 12, the display device 1228, the input device 1230, the speaker 1236, the microphone 1238, the wireless antenna 1242, the video camera 1270, and the power supply 1244 are external to the system-on-chip device 1222. However, each of the display device 1228, the input device 1230, the speaker 1236, the microphone 1238, the wireless antenna 1242, the video camera 1270, and the power supply 1244 can be coupled to a component of the system-on-chip device 1222, such as an interface or a controller.

Figure 13:
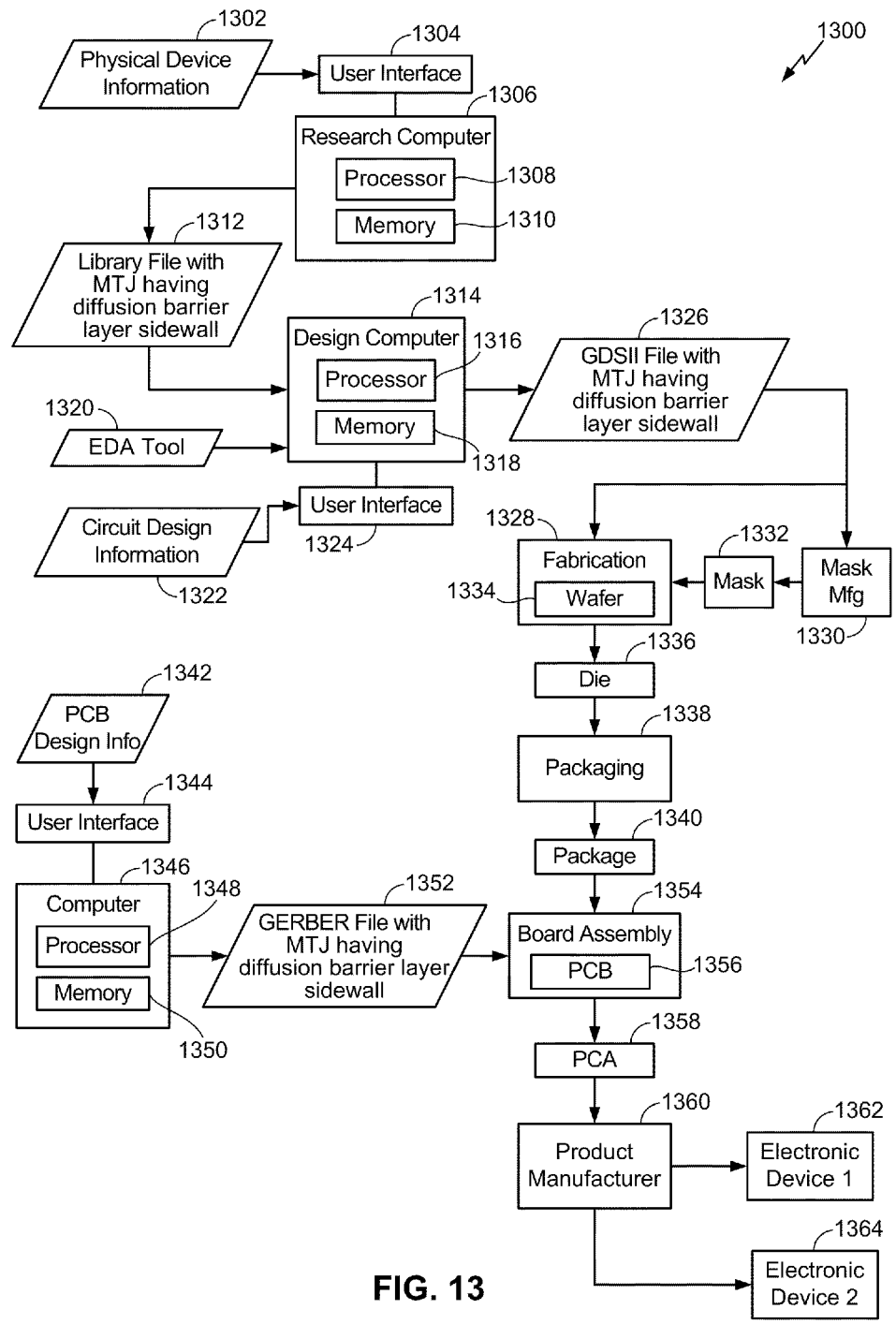
FIG. 13 is a data flow diagram illustrating a manufacturing process for use with magnetic tunnel junction (MTJ) devices.

The foregoing disclosed devices and functionalities (such as the device of FIG. 7, the methods of FIG. 8, FIG. 9, FIG. 10, or FIG. 11, or any combination thereof) may be designed and configured into computer files (e.g., RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The semiconductor chips are then employed in electronic devices. FIG. 13 depicts a particular illustrative embodiment of an electronic device manufacturing process 1300.

Physical device information 1302 is received in the manufacturing process 1300, such as at a research computer 1306. The physical device information 1302 may include design information representing at least one physical property of a semiconductor device, such as the MTJ device 710 of FIG. 7. For example, the physical device information 1302 may include physical parameters, material characteristics, and structure information that is entered via a user interface 1304 coupled to the research computer 1306. The research computer 1306 includes a processor 1308, such as one or more processing cores, coupled to a computer readable medium such as a memory 1310. The memory 1310 may store computer readable instructions that are executable to cause the processor 1308 to transform the physical device information 1302 to comply with a file format and to generate a library file 1312.

In a particular embodiment, the library file 1312 includes at least one data file including the transformed design information. For example, the library file 1312 may include a library of semiconductor devices including the MTJ device 710 of FIG. 7, that is provided for use with an electronic design automation (EDA) tool 1320.

The library file 1312 may be used in conjunction with the EDA tool 1320 at a design computer 1314 including a processor 1316, such as one or more processing cores, coupled to a memory 1318. The EDA tool 1320 may be stored as processor executable instructions at the memory 1318 to enable a user of the design computer 1314 to design a circuit using the MTJ device 710 of FIG. 7, of the library file 1312. For example, a user of the design computer 1314 may enter circuit design information 1322 via a user interface 1324 coupled to the design computer 1314. The circuit design information 1322 may include design information representing at least one physical property of a semiconductor device, such as the MTJ device 710 of FIG. 7. To illustrate, the circuit design property may include identification of particular circuits and relationships to other elements in a circuit design, positioning information, feature size information, interconnection information, or other information representing a physical property of a semiconductor device.

The design computer 1314 may be configured to transform the design information, including the circuit design information 1322, to comply with a file format. To illustrate, the file formation may include a database binary file format representing planar geometric shapes, text labels, and other information about a circuit layout in a hierarchical format, such as a Graphic Data System (GDSII) file format. The design computer 1314 may be configured to generate a data file including the transformed design information, such as a GDSII file 1326 that includes information describing the MTJ device 710 of FIG. 7, in addition to other circuits or information. To illustrate, the data file may include information corresponding to a system-on-chip (SOC) that includes the MTJ device 710 of FIG. 7 and that also includes additional electronic circuits and components within the SOC.

The GDSII file 1326 may be received at a fabrication process 1328 to manufacture the MTJ device 710 of FIG. 7, according to transformed information in the GDSII file 1326. For example, a device manufacture process may include providing the GDSII file 1326 to a mask manufacturer 1330 to create one or more masks, such as masks to be used for photolithography processing, illustrated as a representative mask 1332. The mask 1332 may be used during the fabrication process to generate one or more wafers 1334, which may be tested and separated into dies, such as a representative die 1336. The die 1336 includes a circuit including the MTJ device 710 of FIG. 7.

The die 1336 may be provided to a packaging process 1338 where the die 1336 is incorporated into a representative package 1340. For example, the package 1340 may include the single die 1336 or multiple dies, such as a system-in-package (SiP) arrangement. The package 1340 may be configured to conform to one or more standards or specifications, such as Joint Electron Device Engineering Council (JEDEC) standards.

Information regarding the package 1340 may be distributed to various product designers, such as via a component library stored at a computer 1346. The computer 1346 may include a processor 1348, such as one or more processing cores, coupled to a memory 1350. A printed circuit board (PCB) tool may be stored as processor executable instructions at the memory 1350 to process PCB design information 1342 received from a user of the computer 1346 via a user interface 1344. The PCB design information 1342 may include physical positioning information of a packaged semiconductor device on a circuit board, the packaged semiconductor device corresponding to the package 1340 including the MTJ device 710 of FIG. 7.

The computer 1346 may be configured to transform the PCB design information 1342 to generate a data file, such as a GERBER file 1352 with data that includes physical positioning information of a packaged semiconductor device on a circuit board, as well as layout of electrical connections such as traces and vias, where the packaged semiconductor device corresponds to the package 1340 including the MTJ device 710 of FIG. 7. In other embodiments, the data file generated by the transformed PCB design information may have a format other than a GERBER format.

The GERBER file 1352 may be received at a board assembly process 1354 and used to create PCBs, such as a representative PCB 1356, manufactured in accordance with the design information stored within the GERBER file 1352. For example, the GERBER file 1352 may be uploaded to one or more machines for performing various steps of a PCB production process. The PCB 1356 may be populated with electronic components including the package 1340 to form a representative printed circuit assembly (PCA) 1358.

The PCA 1358 may be received at a product manufacture process 1360 and integrated into one or more electronic devices, such as a first representative electronic device 1362 and a second representative electronic device 1364. As an illustrative, non-limiting example, the first representative electronic device 1362, the second representative electronic device 1364, or both, may be selected from the group of a set top box, a music player, a video player, an entertainment unit, a navigation device, a communications device, a personal digital assistant (PDA), a fixed location data unit, and a computer. As another illustrative, non-limiting example, one or more of the electronic devices 1362 and 1364 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 13 illustrates remote units according to teachings of the disclosure, the disclosure is not limited to these exemplary illustrated units. Embodiments of the disclosure may be suitably employed in any device which includes active integrated circuitry including memory and on-chip circuitry.

Thus, the MTJ device 710 of FIG. 7, may be fabricated, processed, and incorporated into an electronic device, as described in the illustrative process 1300. One or more aspects of the embodiments disclosed with respect to FIGS. 1-11 may be included at various processing stages, such as within the library file 1312, the GDSII file 1326, and the GERBER file 1352, as well as stored at the memory 1310 of the research computer 1306, the memory 1318 of the design computer 1314, the memory 1350 of the computer 1346, the memory of one or more other computers or processors (not shown) used at the various stages, such as at the board assembly process 1354, and also incorporated into one or more other physical embodiments such as the mask 1332, the die 1336, the package 1340, the PCA 1358, other products such as prototype circuits or devices (not shown), or any combination thereof. For example, the GDSII file 1326 or the fabrication process 1328 can include a computer readable tangible medium storing instructions executable by a computer, the instructions including instructions that are executable by the computer to initiate formation of the MTJ device 710 of FIG. 7. Although various representative stages of production from a physical device design to a final product are depicted, in other embodiments fewer stages may be used or additional stages may be included. Similarly, the process 1300 may be performed by a single entity, or by one or more entities performing various stages of the process 1300.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    forming a magnetic tunnel junction structure above a bottom electrode;
    forming a diffusion barrier layer above and adjacent to the magnetic tunnel junction structure, wherein the diffusion barrier layer is formed of a first material;
    etching back the diffusion barrier layer, wherein etching back the diffusion barrier layer includes removing a first portion of the diffusion barrier above the magnetic tunnel junction structure;
    forming a cap layer above and adjacent to a second portion of the diffusion barrier layer that is adjacent to the magnetic tunnel junction structure, wherein the cap layer is above the bottom electrode, and wherein the cap layer is formed of the first material;
    forming an insulating layer above the cap layer; and
    connecting a top of the magnetic tunnel junction structure to a conductive layer.

2. The method of claim 1, further comprising performing an in-situ sputter clean to remove an oxidation layer from the magnetic tunnel junction structure before forming the diffusion barrier layer.

3. The method of claim 1, wherein etching back the diffusion barrier layer leaves the portion of the diffusion barrier layer that is adjacent to the magnetic tunnel junction structure.

4. The method of claim 1, wherein the diffusion barrier layer is formed in-situ and wherein the diffusion barrier layer includes silicon carbide.

5. The method of claim 1, wherein etching back the diffusion barrier layer is performed in-situ.

6. The method of claim 1, wherein etching back the diffusion barrier layer is performed without formation of an oxidation layer on the magnetic tunnel junction structure.

7. The method of claim 1, wherein etching back the diffusion barrier layer has an increased over-etch process margin.

8. The method of claim 1, wherein the bottom electrode includes at least one of tantalum and tantalum nitride.

9. The method of claim 1, wherein the diffusion barrier layer includes silicon nitride.

10. The method of claim 1, wherein the etching and the connecting are initiated by a processor integrated into an electronic device.

11. An apparatus comprising:
a semiconductor device formed by the method of claim 1.

12. The apparatus of claim 11, integrated in at least one semiconductor die.

13. The apparatus of claim 11, further comprising a device selected from the group consisting of a set top box, a music player, a video player, an entertainment unit, a navigation device, a communications device, a personal digital assistant (PDA), a fixed location data unit, and a computer, into which the semiconductor device is integrated.

14. A method comprising:
receiving design information representing at least one physical property of a semiconductor device, the semiconductor device formed by the method of claim 1;
transforming the design information to comply with a file format; and
generating a data file including the transformed design information.

15. The method of claim 14, wherein the data file includes a GDSII format.

16. A method comprising:
receiving a data file including design information corresponding to a semiconductor device; and
fabricating the semiconductor device according to the design information, wherein the semiconductor device is formed by the method of claim 1.

17. The method of claim 16, wherein the data file has a GDSII format.

18. A method comprising:
receiving design information including physical positioning information of a packaged semiconductor device on a circuit board, the packaged semiconductor device including a semiconductor structure formed by the method of claim 1; and
transforming the design information to generate a data file.

19. The method of claim 18, wherein the data file has a GERBER format.

20. A method comprising:
receiving a data file including design information including physical positioning information of a packaged semiconductor device on a circuit board; and
manufacturing the circuit board configured to receive the packaged semiconductor device according to the design information, wherein the packaged semiconductor device includes a semiconductor structure formed by the method of claim 11.

21. The method of claim 20, wherein the data file has a GERBER format.

22. The method of claim 20, further comprising integrating the circuit board into a device selected from the group consisting of a set top box, a music player, a video player, an entertainment unit, a navigation device, a communications device, a personal digital assistant (PDA), a fixed location data unit, and a computer.

23. The method of claim 1, further comprising:
planarizing the insulating layer to form a planarized insulating layer, wherein planarizing the insulating layer opens a top of the magnetic tunnel junction structure; and
forming a top electrode adjacent to the planarized insulating layer and adjacent to the top of the magnetic tunnel junction structure.

24. The method of claim 23, further comprising patterning the top electrode and the bottom electrode.

25. The method of claim 23, further comprising performing a copper damascene process to open a top metal trench in the third insulating layer to the top electrode, to plate copper, and to perform a copper chemical mechanical planarization.

26. The method of claim 1, further comprising:
forming a bottom cap layer above a first insulating layer;
performing a copper damascene process to open a bottom metal trench and a bottom via in the first insulating layer, to plate copper, and to perform a copper chemical mechanical planarization; and
forming the bottom electrode above the bottom cap layer and above the copper in the bottom metal trench.

27. A method comprising:
forming magnetic tunnel junction layers above a bottom electrode;
patterning a magnetic tunnel junction structure using an etching process stopping at the bottom electrode;
performing an in-situ sputter clean to remove a sidewall oxidation layer from a sidewall of the magnetic tunnel junction structure;
forming a diffusion barrier layer above and adjacent to the magnetic tunnel junction structure, wherein the diffusion barrier layer is formed of a first material;
etching back the diffusion barrier layer, wherein etching back the diffusion barrier layer includes:
removing a a first portion of the diffusion barrier layer from a top of the magnetic tunnel junction structure; and
leaving a second portion of the diffusion barrier layer adjacent to the magnetic tunnel junction structure;
forming a cap layer above and adjacent to the second portion, wherein the cap layer is above the bottom electrode, and wherein the cap layer is formed of a first material;
forming an insulating layer above the cap layer;
planarizing the insulating layer and the top of the magnetic tunnel junction structure; and
connecting the top of the magnetic tunnel junction structure to a conductive layer.

28. The method of claim 27, wherein the diffusion barrier layer is formed in-situ and wherein etching back the diffusion barrier layer is performed in-situ.

29. The method of claim 27, wherein the first material is silicon nitride.

30. The method of claim 27, wherein the etching and the connecting are initiated by a processor integrated into an electronic device.

31. The method of claim 27, further comprising forming a top electrode adjacent to the planarized insulating layer and adjacent to the top of the magnetic tunnel junction structure.

32. The method of claim 31, further comprising patterning the top electrode and the bottom electrode.

33. The method of claim 31, further comprising performing a copper damascene process to open a top metal trench in the third insulating layer to the top electrode, to plate copper, and to perform a copper chemical mechanical planarization.

34. The method of claim 27, further comprising:
 forming a bottom cap layer above a first insulating layer;
 performing a copper damascene process to open a bottom metal trench and a bottom via in the first insulating layer, to plate copper, and to perform a copper chemical mechanical planarization; and
 forming the bottom electrode above the bottom cap layer and above the copper in the bottom metal trench.

35. The method of claim 27, wherein etching back the diffusion barrier layer is performed without formation of an oxidation layer on the magnetic tunnel junction structure using one or more chemicals which do not include oxygen.

36. A method comprising:
 forming a bottom cap layer above a first insulating layer;
 performing a first copper damascene process to open a bottom metal trench and a bottom via in the first insulating layer, to plate copper, and to perform a copper chemical mechanical planarization;
 forming a bottom electrode above the bottom cap layer and above the copper in the bottom metal trench;
 forming magnetic tunnel junction layers above the bottom electrode;
 forming a hardmask above the magnetic tunnel junction layers;
 patterning magnetic tunnel junction structures;
 forming a diffusion barrier layer above and adjacent to the magnetic tunnel junction structures and above the bottom electrode;
 etching back the diffusion barrier layer, leaving a portion of the diffusion barrier layer adjacent to the magnetic tunnel junction structures;
 forming a cap layer above and adjacent to the portion of the diffusion barrier layer adjacent to the magnetic tunnel junction structures and above the bottom electrode;
 forming a second insulating layer above the cap layer;
 planarizing the second insulating layer and opening tops of the magnetic tunnel junction structures;
 forming a top electrode above the planarized second insulating layer and above the tops of the magnetic tunnel junction structures;
 patterning the top electrode and the bottom electrode;
 forming and planarizing a third insulating layer above the patterned top electrode and above the bottom cap layer; and
 performing a second copper damascene process to open a top metal trench in the third insulating layer to the patterned top electrode, to plate second copper, and to perform a second copper chemical mechanical planarization.

37. The method of claim 36, wherein an easy axis magnetic tunnel junction magnetic anneal of at least one of the magnetic tunnel junction layers aligns a magnetic field orientation of the magnetic tunnel junction structures.

38. The method of claim 36, wherein the bottom cap layer includes silicon carbide.

39. The method of claim 36, wherein the bottom electrode includes at least one of tantalum and tantalum nitride.

40. The method of claim 36, wherein the diffusion barrier layer includes silicon nitride.

41. The method of claim 36, wherein the cap layer includes silicon nitride.

42. The method of claim 36, wherein the top electrode includes at least one of tantalum and tantalum nitride.

43. The method of claim 36, wherein forming the diffusion barrier layer and etching back the diffusion barrier layer are initiated by a processor integrated into an electronic device.

44. The method of claim 36, wherein the diffusion barrier layer is formed of a first material, and wherein the cap layer is formed of the first material.

45. A method comprising:
 a first step for forming a magnetic tunnel junction structure above a bottom electrode;
 a second step for forming a diffusion barrier layer above and adjacent to the magnetic tunnel junction structure, wherein the diffusion barrier layer is formed of a first material;
 a third step for etching back the diffusion barrier layer, wherein etching back the diffusion barrier layer includes removing the diffusion barrier layer above the magnetic tunnel junction structure;
 a fourth step for forming a cap layer above and adjacent to a portion of the diffusion barrier layer that is adjacent to the magnetic tunnel junction structure, wherein the cap layer is above the bottom electrode, and wherein the cap layer is formed of the first material;
 a fifth step for forming an insulating layer above the cap layer; and
 a sixth step for connecting a top of the magnetic tunnel junction structure to a conductive layer.

46. The method of claim 45, wherein the first step, the second step, the third step, and the fourth step are initiated by a processor integrated into an electronic device.

\* \* \* \* \*